United States Patent [19]
Wang et al.

[11] Patent Number: 5,729,563
[45] Date of Patent: Mar. 17, 1998

[54] METHOD AND APPARATUS FOR OPTICALLY AND THERMALLY ISOLATING SURFACE EMITTING LASER DIODES

[75] Inventors: Shih-Yuan Wang, Palo Alto; Michael R. T. Tan, Menlo Park, both of Calif.

[73] Assignee: Hewlett-Packard Company, Palo Alto, Calif.

[21] Appl. No.: 271,606

[22] Filed: Jul. 7, 1994

[51] Int. Cl.$^6$ ................................................. H01S 3/18
[52] U.S. Cl. ............................................. 372/50; 372/96
[58] Field of Search ................................. 372/50, 96, 45

[56] References Cited

U.S. PATENT DOCUMENTS

| | | | |
|---|---|---|---|
| 4,979,002 | 12/1990 | Pavkove | 357/17 |
| 5,073,806 | 12/1991 | Idei | 372/50 |
| 5,101,246 | 3/1992 | Onodera | 372/50 |
| 5,216,263 | 6/1993 | Paoli | 372/50 |
| 5,247,536 | 9/1993 | Kinoshita | 372/50 |
| 5,258,990 | 11/1993 | Olbright et al. | 372/96 |
| 5,298,735 | 3/1994 | Peterson et al. | 257/82 |
| 5,307,360 | 4/1994 | Roustin | 372/43 |
| 5,319,655 | 6/1994 | Thornton | 372/45 |
| 5,408,105 | 4/1995 | Adachi et al. | 372/45 |
| 5,513,200 | 4/1996 | Paoli | 372/50 |

FOREIGN PATENT DOCUMENTS

| | | | |
|---|---|---|---|
| 0 493 055 A3 | 7/1992 | European Pat. Off. | H01L 27/15 |
| 0 549 405 A1 | 6/1993 | France | H01L 21/603 |
| 56-1590 | 1/1981 | Japan | 372/50 |
| 61-89691 | 5/1986 | Japan | 372/50 |
| 2-56986 | 2/1990 | Japan | 372/45 |

OTHER PUBLICATIONS

Hadley, Ronald G., "Modes of a two–dimensional phase–locked array of VCSEL," 1990 Optical Society of America.

Jewell, Jack L., et al., "Vertical–Cavity Surface–Emitting Lasers: Design, Growth, Fabrication, Characterization", IEEE Journal of Quantum Electronics, vol. 27, No. 6, Jun. 1991, pp. 1332-1346.

Yoo, H. J. et al., "Phase-Locked Two-Dimensional Arrays of Implant Isolated Vertical Cavity Surface Emitting Lasers", Electronics Letters, vol. 26, No. 23, Nov. 1990, pp. 1944-1946.

Ohiso, Y. et al., "Thermal Interference in a 0.85 μm 8×8 Two-Dimensional Vertical-Cavity Surface-Emitting Laser Array", Electronics Letters, vol. 30, No. 18, Sep. 1994, pp. 1491-1492.

*Primary Examiner*—Rodney B. Bovernick
*Assistant Examiner*—Yisun Song

[57] ABSTRACT

An SEL array having improved optical isolation and heat conduction. The SEL array is constructed from a light generation layer and first and second mirror layers that sandwich the light generation layer. The first mirror and second mirrors reflect light generated in the light generation layer back toward the light generation layer. The first mirror includes a plurality of light isolation regions, each light isolation region extending through the first mirror. The light isolation regions divide the light generation layer into a plurality of light generation regions. Each light generation region corresponds to one of the SELs. Each light isolation region is positioned to prevent light generated in one of the light generation regions from propagating into a neighboring light generation region. In one embodiment of the present invention, the light isolation regions are constructed by providing trenches that extend from the surface of the SEL array through the first mirror. The trenches may be filled with a light absorbing material. The trenches may also be filled with a heat conducting material thereby providing an improved heat dissipation path for heat generated by the SELs. The light isolation regions may also be generated by ion-implanting regions between the SELs or by disordering one of the mirrors in regions between the SELs.

6 Claims, 6 Drawing Sheets

METHOD AND APPARATUS FOR OPTICALLY AND THERMALLY ISOLATING SURFACE EMITTING LASER DIODES

FIELD OF THE INVENTION

The present invention relates to lasers, and more particularly, to an improved method for isolating individual surface emitting laser diodes in an array of such diodes.

BACKGROUND OF THE INVENTION

Semiconductor laser diodes were originally fabricated in a manner that led to a diode structure that was parallel to the surface of the semiconductor wafer. In this structure, light is emitted from the edge of the structure such that the light was also emitted parallel to the surface of the semiconductor wafer. Unfortunately, this structure does not lend itself to the cost-effective fabrication of two-dimensional arrays of laser diodes.

A second class of laser diodes is fabricated such that the laser structure is perpendicular to the surface of the semiconductor wafer and the light is emitted perpendicular to the surface. These laser diodes are commonly known as surface emitting lasers (SELs). These lasers are better suited for the fabrication of arrays of laser for displays, light sources, optical scanners, and data links for optical scanners.

In closely packed arrays of laser diodes, thermal and optical isolation can be significant problems. An SEL is typically fabricated by sandwiching a light emitting layer between two mirror regions. Each mirror region is constructed by depositing alternating layers of different refractive indices to form a Bragg mirror. In an array of such SELs, the individual SELs are constructed from common light generation and mirror layers. The locations of the individual SELs are determined by various electrodes and implant regions introduced after the fabrication of the common layers. The layers in the Bragg mirror adjacent to the light generation layer can act as a light pipe for transporting light generated in one SEL to an adjacent SEL. This coupling is particularly troublesome in arrays of cells having one SEL and a corresponding photodiode that monitors the light output of the SEL in its cell. In this case, the photodiode cannot distinguish light from an SEL in an adjacent cell from light generated by the SEL in its cell. Hence, an erroneous monitoring signal may be generated by the light leaking from the adjacent cell. The coupling of light from one SEL to another can also degrade the performance of the receiving SEL.

The power generated in individual SELs may be sufficient to raise the temperature of an adjacent SEL. Since the characteristics of the individual SELs vary with temperature, it would be advantageous to isolate the SELs thermally as well as optically as much as possible. In addition, it would be advantageous to provide a means for removing heat from the individual SELs to prevent the temperature of the entire array from reaching unacceptable levels.

Broadly, it is the object of the present invention to provide an improved SEL array.

It is a further object of the present invention to provide an SEL array in which the individual SELs are isolated optically.

It is a still further object of the present invention to provide an SEL array in which the individual SELs are isolated thermally.

It is yet another object of the present invention to provide an SEL array in which heat generated by the individual SELs is removed from the array.

These and other objects of the present invention will become apparent to those skilled in the art from the following detailed description of the invention and the accompanying drawings.

SUMMARY OF THE INVENTION

The present invention is an SEL array constructed from a light generation layer and first and second mirror layers that sandwich the light generation layer. The first mirror and second mirrors reflect light generated in the light generation layer back toward the light generation layer. The first mirror includes a plurality of light isolation regions, each light isolation region extending through the first mirror. The light isolation regions divide the light generation layer into a plurality of regions. Each such region corresponds to one of the SELs. Each light isolation region is positioned to prevent light generated in one of the light generation regions from propagating into a neighboring light generation region. In one embodiment of the present invention, the light isolation regions are constructed by providing trenches that extend from the surface of the SEL array through the first mirror. The trenches may be filled with a light absorbing material. The trenches may also be filled with a heat conducting material thereby providing an improved heat dissipation path for heat generated by the SELs. The light isolation regions may also be generated by ion-implanting regions between the SELs or by dis-ordering one of the mirrors in the regions between the SELs.

DETAILED DESCRIPTION OF THE INVENTION

Figure 1:
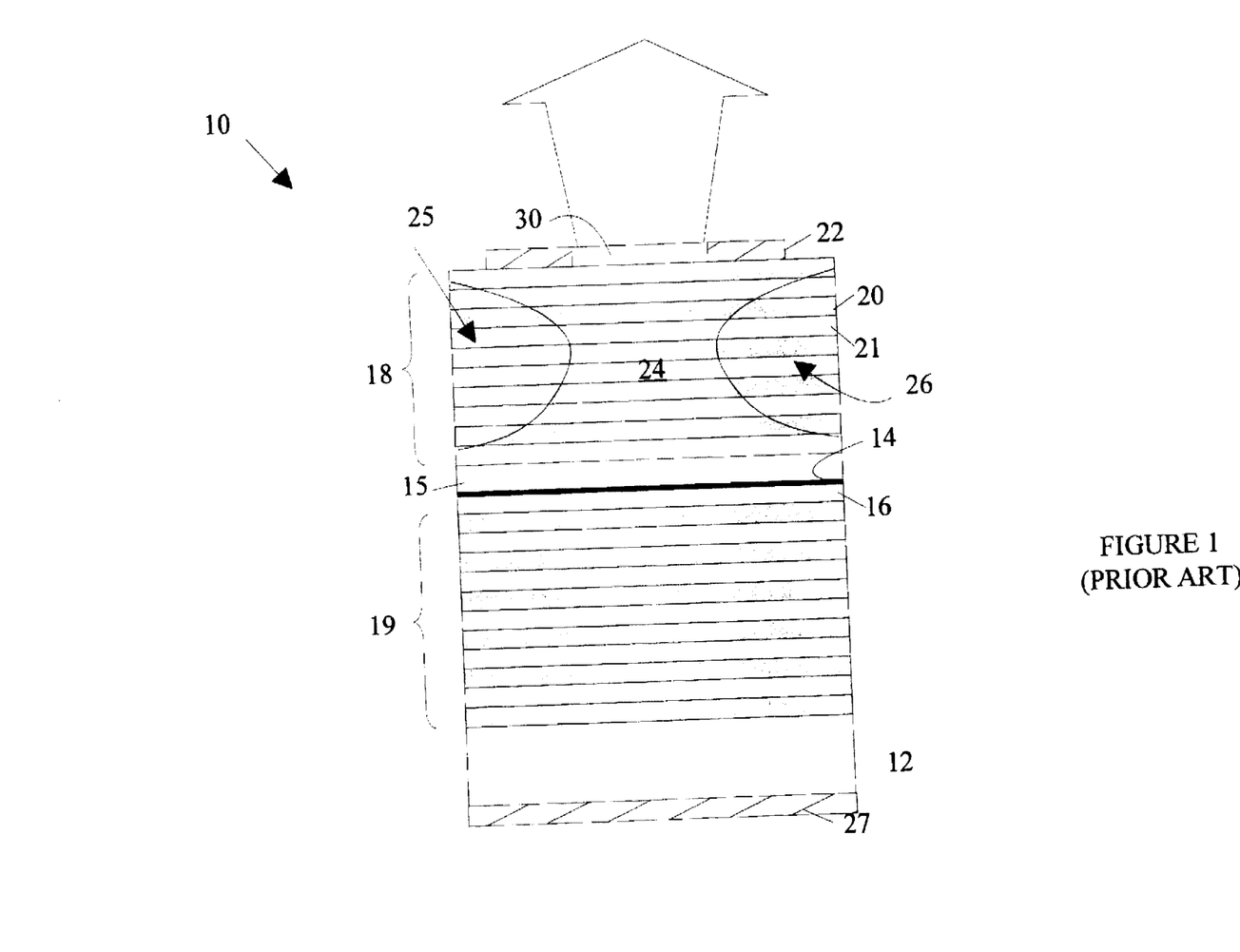
FIG. 1 is cross-sectional view of a conventional SEL.

The present invention may be more easily understood with reference to FIG. 1 which is a cross-sectional view of a conventional SEL 10. Since construction of SELs is well known to those skilled in the laser arts, it will not be described in detail here. For the purposes of this discussion, it is sufficient to note that SEL 10 may be viewed as a p-i-n diode having a top mirror region 18, a light generation region 14, and bottom mirror region 19. These regions are constructed on a substrate 12. Electrical power is applied between electrodes 22 and 27. The various layers are constructed by epitaxial growth.

The active region is typically constructed from one or more quantum wells of InGaAs, GaAs, AlGaAs, or InAlGaAs which is separated from mirror regions 18 and 19 by spacers 15 and 16 respectively. The choice of material depends on the desired wavelength of the light emitted by the SEL. In addition, devices based on bulk active regions are known to the art. This layer 14 may be viewed as a light generation layer which generates light due to spontaneous and stimulated emission via the recombination of electrons and holes generated by forward biasing the p-i-n diode.

The mirror regions are constructed from alternating layers of which layers 20 and 21 are typical. These layers have different indices of refraction. The thickness of each layer is chosen to be one quarter of the wavelength of the light. The stacks form Bragg mirrors. The stacks are typically constructed from alternating layers of AlAs and GaAs or AlGaAs. To obtain the desired reflectivity, 20 to 30 pairs of layers are typically required. The layers in the upper mirror region 18 are typically doped to be p-type semiconductors and those in the lower mirror region 19 are doped to be n-type semiconductors. Substrate 12 is preferably n-type. Bottom electrode 27 is preferably an n-ohmic contact. However, n-i-p diode structures may also be constructed by growing the structures on a p-substrate or a semi-insulating substrate with a p-layer deposited thereon.

The current flow between electrodes 22 and 27 is confined to region 24 by implanting regions 25 and 26 to convert the regions to regions of high resistivity. This is typically accomplished by implanting with hydrogen ions.

It should be noted that SEL 10 is not shown to scale in FIG. 1. In particular, the mirror regions and active regions have been expanded to provide clarity in the drawing. In practice, the thickness of region 12 is typically 150 μm compared to about 10 μfor the mirror and active regions. Window 30 in top electrode 22 is approximately 10 μm in diameter while bottom electrode 27 covers the bottom of the substrate.

Figure 2:
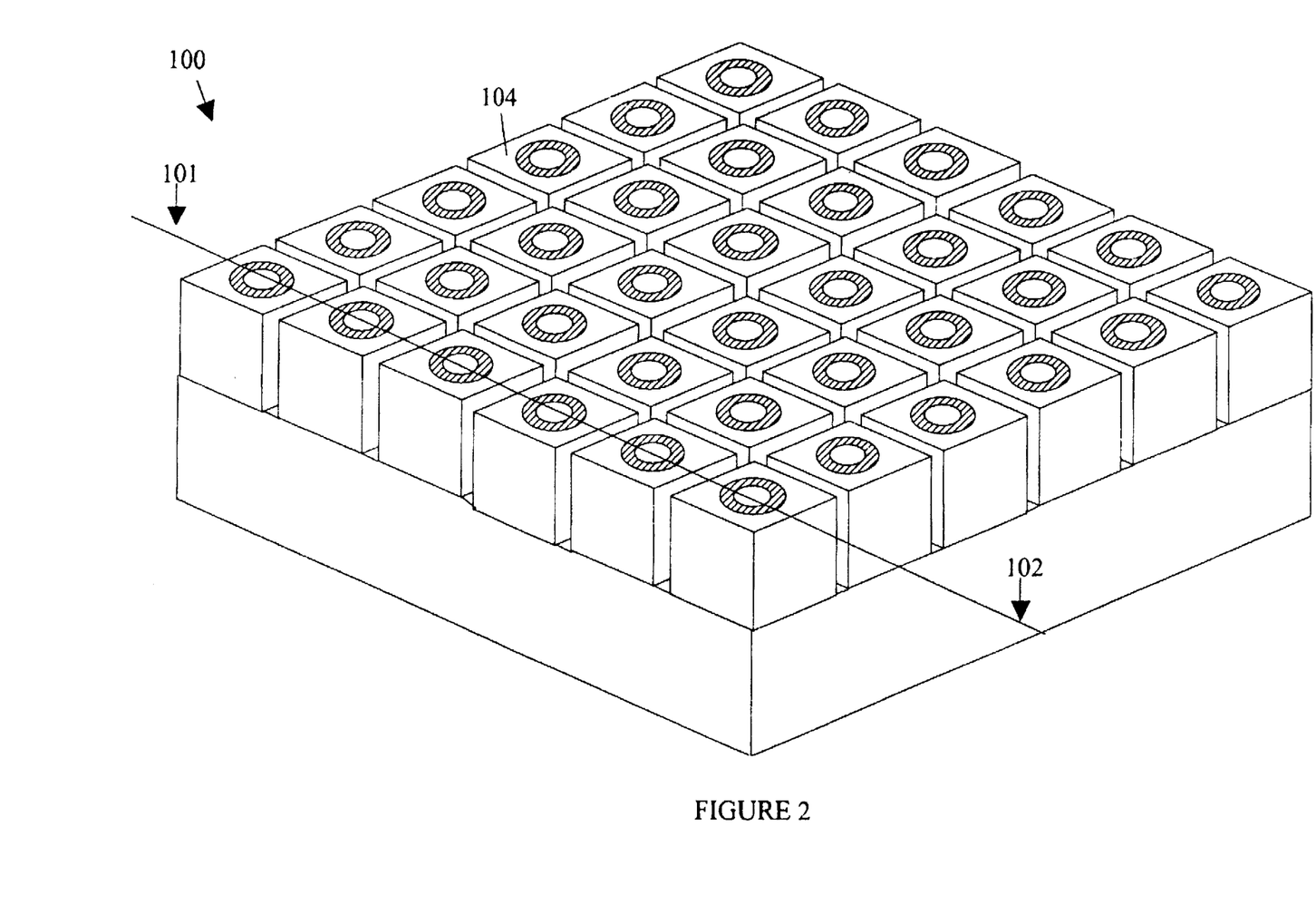
FIG. 2 is a prospective view of one embodiment of an SEL array according to the present invention.

An array of SELs according to the present invention can be constructed by first depositing the layers making up the bottom mirror region, active region, and top mirror region on a substrate and then dividing the layers into individual SELs. FIG. 2 is a perspective view of an array of SELs created in this manner. The array is constructed on a substrate 112 and then divided into individual SELs of which SEL 104 is typical.

Figure 3:
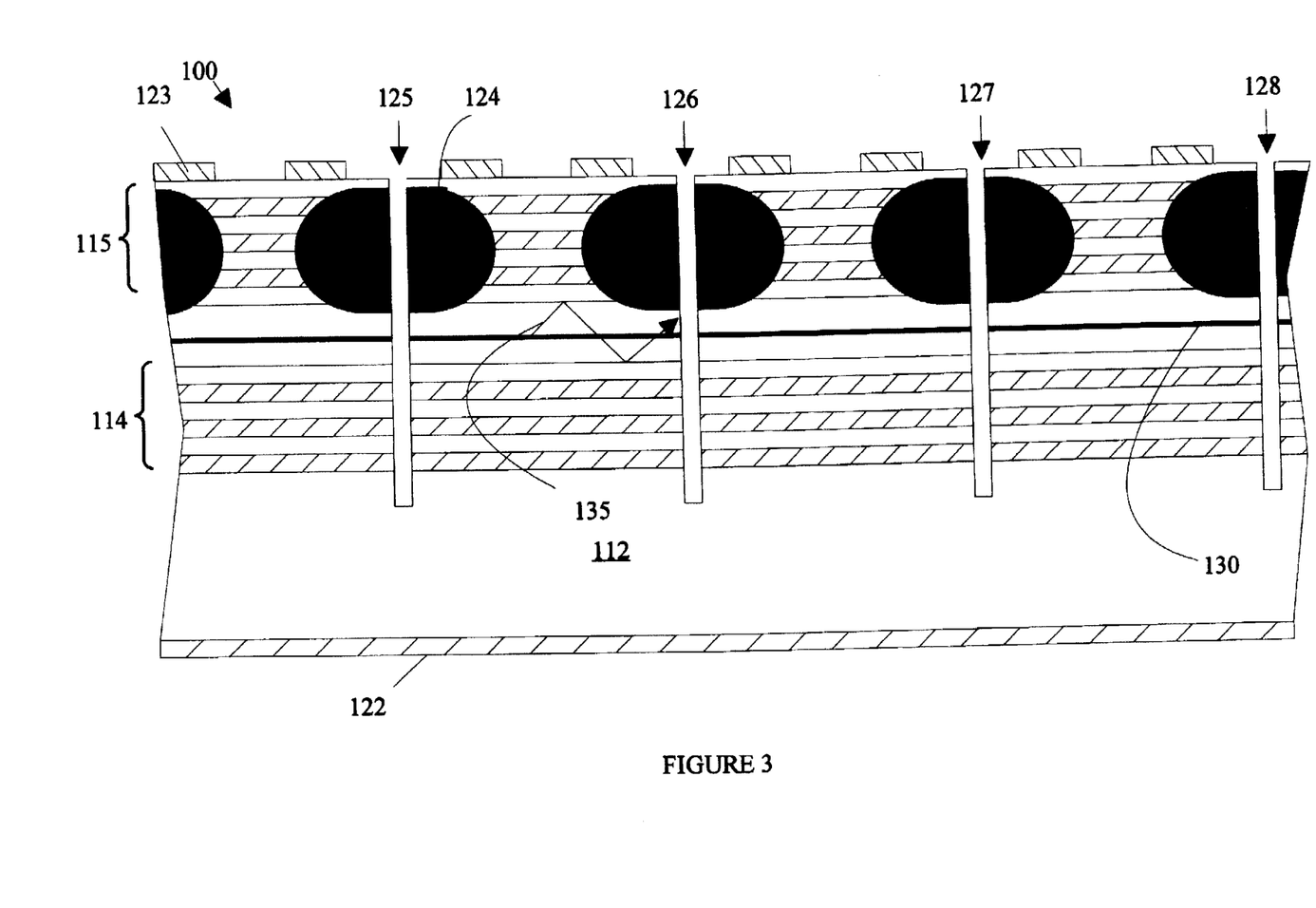
FIG. 3 is a cross-sectional view of the array shown in FIG. 2.

Refer now to FIG. 3 which is cross-sectional view of array 100 through line 101–102 shown in FIG. 2. Array 100 is constructed from a bottom mirror region 114, an active region 130 and a top mirror region 115. These regions are deposited on substrate 112 prior to implanting top mirror region 115 with implant regions such as implant region 124. The top electrodes 123 are then deposited on the surface of the top mirror region 115. A continuous bottom electrode 122 is used in conjunction with the top electrodes to power the device.

While the implant regions and positioning of the top electrodes 123 are sufficient to channel the currents, these are not sufficient to provide electrical isolation. In conventional SEL arrays, an additional implant region is used to isolate the various SELs from one another electrically. However, even with this additional implant region light generated in the active region of one SEL can propagate into a neighboring SEL. Photons leaving active region 130 in a direction sufficiently oblique to the mirror regions can be trapped between mirror regions 114 and 115, and hence, propagate into a neighboring region. In effect, the top and bottom mirror regions form the walls of a light pipe which trap photons generated in the light generation region at oblique angles. Such a photon is shown at 135 in FIG. 3. To prevent this type of light propagation, trenches are etched between the SELs. Exemplary trenches are shown at 125–128 in FIG. 3. These trenches intercept any light trapped between the mirror regions, and thus, prevent the propagation of light between SELs in the array. As will be discussed in more detail below, these trenches may also be used to conduct heat out of the array.

If the walls of the trench are sufficiently rough, an empty trench may be sufficient for the purposes of optical isolation of the SELs. However, in the preferred embodiment of the present invention, the trenches are filled with an opaque material such as an opaque material comprising a polyimide mixed with a dye that absorbs light at the wavelength generated by the active region. In the visible range, rhodamine 6G may be used. Photoresist may also be used to fill the trenches. The preferred material for filling the trenches is spin-on glass because it provides passivation. The glass may be doped with dyes. In many cases, the change in indices of refraction is sufficient to impede the transmission of the light.

Figure 4:
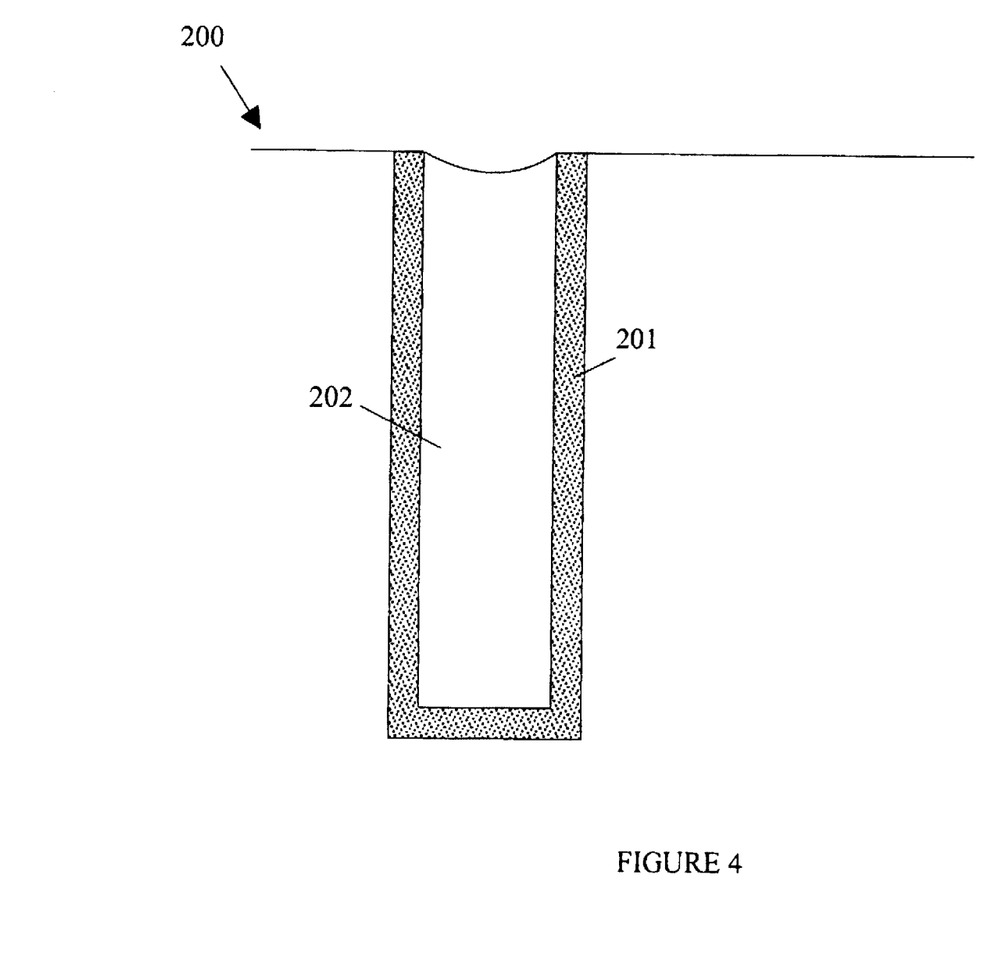
FIG. 4 is a cross-section of a trench used to construct an optical isolation region according to the present invention.

The trenches can be filled with heat conducting material to form heat pipe for removing heat from the array. For example, the trenches can be coated with silicon carbide which is a dielectric material with good heat conducting properties. If an electrically conducting material such as gold or aluminum is used as the heat conducting material, the walls of the trenches must be coated with an insulator such as silicon carbide. A cross-sectional view of a filled trench is shown in FIG. 4 at 200. A dielectric layer 201 is deposited on the walls of trench 200 prior to filling trench 200 with a heat conducting material 202.

While the trenches shown in FIG. 3 extend through both mirror regions into the substrate 112, for the purposes of optical isolation, the trenches need only extend to the active region so as to prevent the propagation of light trapped in the active region between the top and bottom mirror regions. The deeper trenches have the advantage of providing both electrical and optical isolation.

Figure 5:
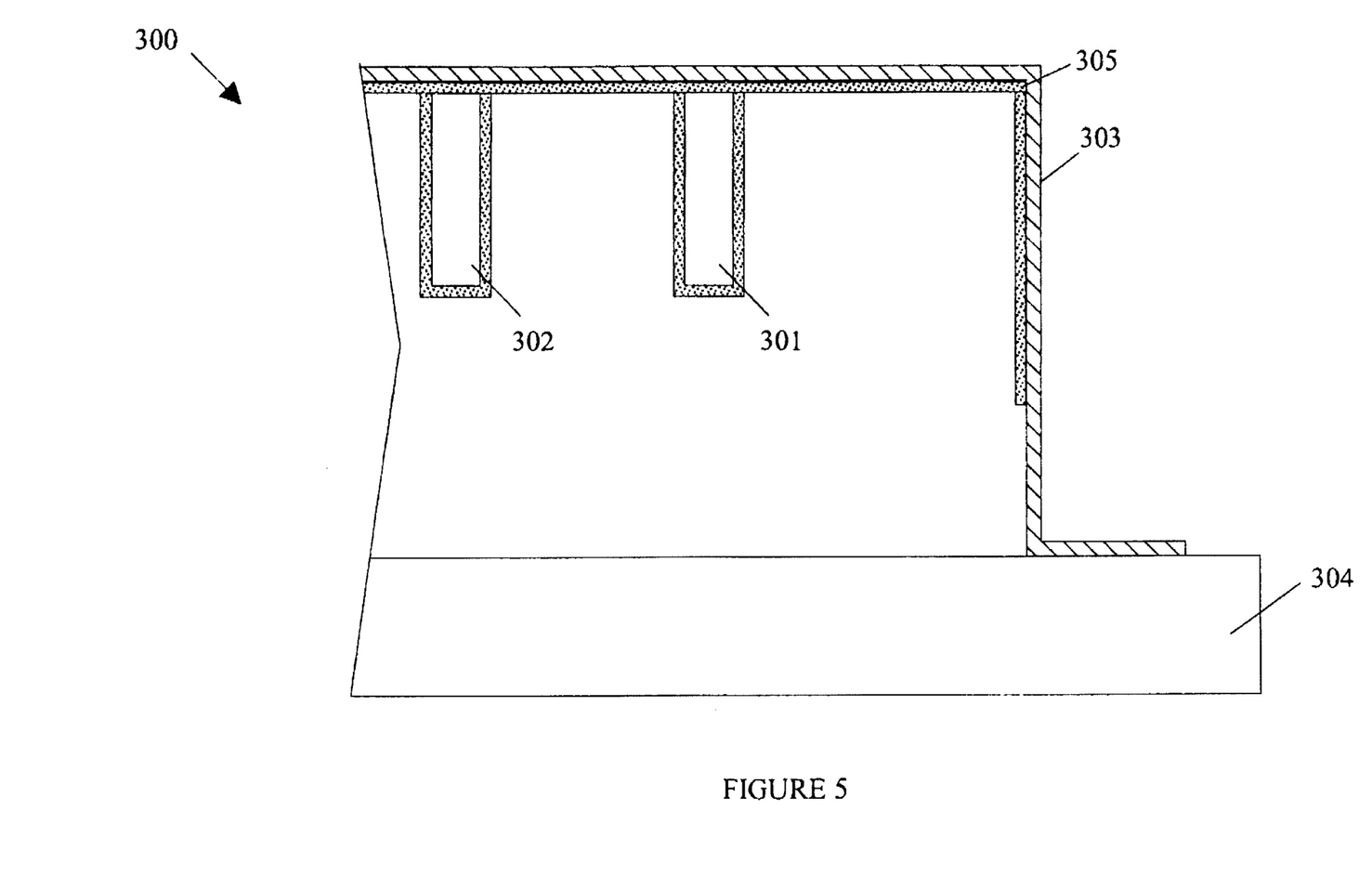
FIG. 5 is a cross-sectional view of an embodiment of the present invention utilizing a heat conducting layer to transfer heat from the SEL array to a heat sink.

The various trenches may be connected via a heat conducting layer or trace to an off-chip heat sink as illustrated in FIG. 5. FIG. 5 is a cross-sectional view of a portion of an array 300 of SELs showing two filled trenches 301 and 302. The trenches are connected to a heat conducting layer 303 which conducts the heat from the trenches, and from the surface of the chip, to a heat sink 304. A thin dielectric layer 305 such as silicon carbide may be used to electrically isolate the heat conducting layer 303 from other electrically conducting structures on the surface of array 300 such as the top electrodes of the SELs. It will be apparent to those skilled in the art that windows must be opened in layer 303 over the windows in the SELs to allow the light to exit the SELs.

If a sufficient portion of the top surface of the SEL array is in contact with layer 303, the trenches do not need to be filled with heat conducting material. In this case, a thin layer of dielectric is deposited on the surface of the SEL array and covered with a second heat conducting layer. Vias are opened over the top electrodes and windows in both layers. A second dielectric layer may be used to provide electrical isolation between the heat conducting layer and metalization layers used to make connections to the top electrodes.

Figure 6:
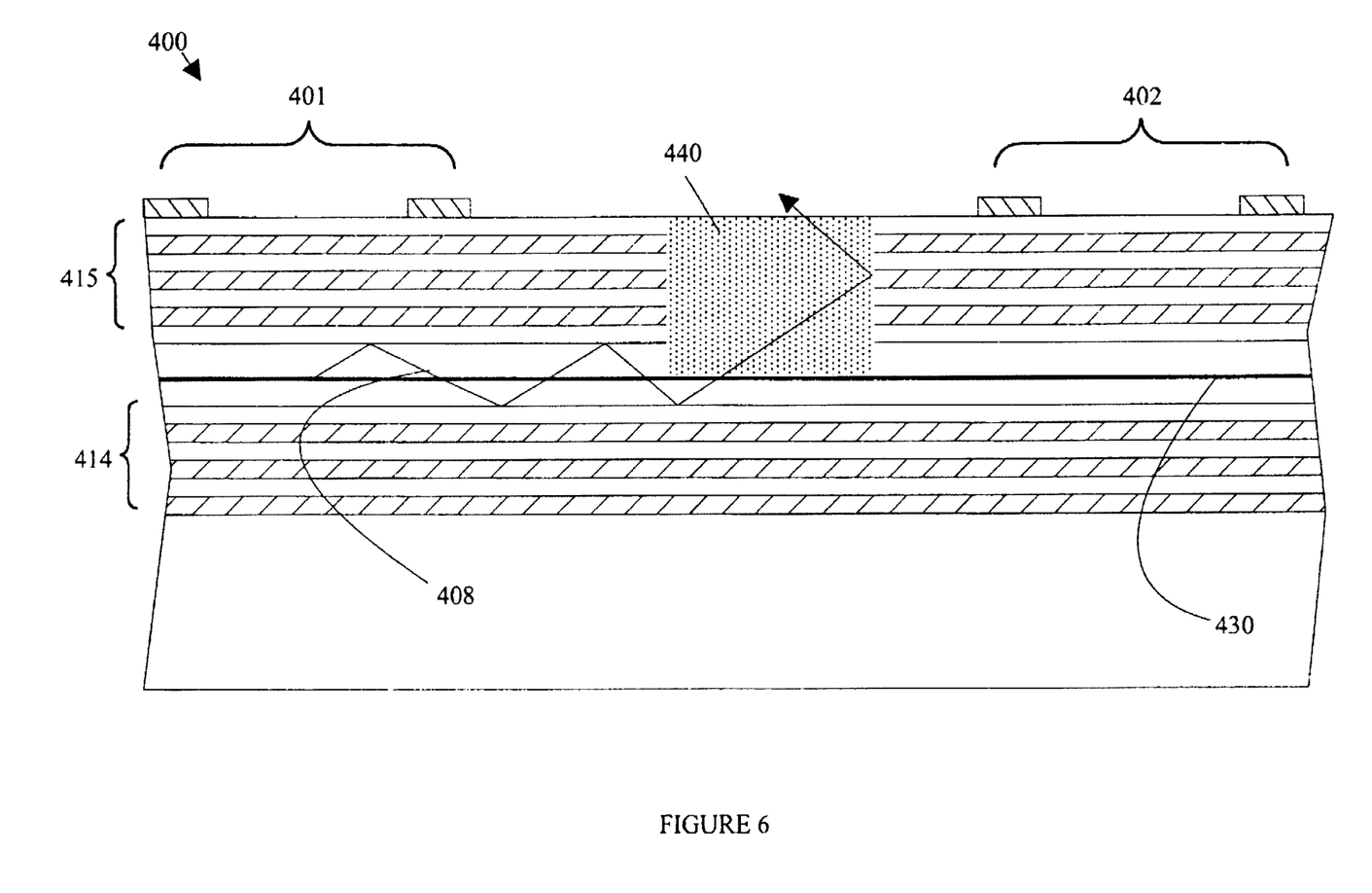
FIG. 6 is a cross-sectional view of another embodiment of the present invention.

In those cases in which heat conducting trenches are not needed, the optical isolation may be accomplished by providing a region that either absorbs light or captures light and directs the captured light out of the SEL array in place of the trenches discussed above. Refer now to FIG. 6 which is a cross-sectional view of a portion of an SEL array 400 through two SELs 401 and 402. A region 440 in the top Bragg mirror 415 has been disordered to destroy the boundaries between the layers of the mirror. When light generated in active region 430 that is trapped between the mirror layers enters region 440, the light is no longer reflected by the top mirror, since that mirror has been destroyed by the disordering. The light so entering region 440 is reflected from the sides of region 440 and eventually exits the SEL array as shown at 408.

Methods for disordering regions are known to the art, and hence, will not be discussed in detail here. For the purposes of the present discussion, it is sufficient to note that a disordered region may be provided by localized heating or diffusion or implantation of ions into the region. In addition, combinations of heating and ion implantation or diffusion may be used.

The light isolation function may also be provided by ion-implanting a region between adjacent SELs to create a light absorbing region that extends from the surface through the top mirror region. Such a region absorbs the stray light rather than conducting the light out of the SEL array. The ion implantation may be accomplished by implanting with a very heavy dose of hydrogen, typically in excess of $10^{15}$ ions/cm$^2$.

Various modifications to the present invention will become apparent to those skilled in the art from the foregoing description and accompanying drawings. Accordingly, the present invention is to be limited solely by the scope of the following claims.

What is claimed is:

1. An SEL array comprising a plurality of SELs, said SEL array comprising:

a light generation layer for generating light in response to light passing therethrough;

first mirror means for reflecting light generated in said light generation layer toward said light generation layer;

second mirror means for reflecting light generated in said light generation layer toward said light generation layer, said first and second mirror means being located on opposite sides of said light generation layer; and a plurality of light isolation regions, each said light isolation region extending through said first mirror means to said second mirror means, said light isolation dividing said light generation layer into a plurality of light generation regions, each said light generation region corresponding to one of said SELs, each said light isolation region preventing light generated in one of said light generation regions from propagating into a neighboring light generation region, wherein one of said light isolation regions comprises a trench extending through said light generation layer.

2. An SEL array comprising a plurality of SELs, said SEL array comprising:

a light generation layer for generating light in response to light passing therethrough;

first mirror means for reflecting light generated in said light generation layer toward said light generation layer;

second mirror means for reflecting light generated in said light generation layer toward said light generation layer, said first and second mirror means being located on opposite sides of said light generation layer; and a plurality of light isolation regions, each said light isolation region extending through said first mirror means to said second mirror means, said light isolation dividing said light generation layer into a plurality of light generation regions, each said light generation region corresponding to one of said SELs, each said light isolation region being positioned to prevent light generated in one of said light generation regions from propagating into a neighboring light generation region, wherein one of said light isolation regions comprises a trench extending through said light generation layer, said trench being filled with a light absorbing material that renders said trench opaque to light generated in said light generation layer.

3. The SEL array of claim 2 wherein said light absorbing material comprises a heat conducting material.

4. An SEL array comprising a plurality of SELs, said SEL array comprising:

a light generation layer for generating light in response to light passing therethrough;

first mirror means for reflecting light generated in said light generation layer toward said light generation layer;

second mirror means for reflecting light generated in said light generation layer toward said light generation layer, said first and second mirror means being located on opposite sides of said light generation layer; and a plurality of light isolation regions, each said light isolation region extending through said first mirror means to said second mirror means, said light isolation dividing said light generation layer into a plurality of light generation regions, each said light generation region corresponding to one of said SELs, each said light isolation region being positioned to prevent light generated in one of said light generation regions from propagating into a neighboring light generation region, one of said isolation regions comprises a region of said first mirror means which absorbs or deflects any light incident thereon, thereby preventing any light from propagating between two of said SELs adjacent to that isolation region.

5. An SEL array comprising a plurality of SELs, said SEL array comprising:

a light generation layer for generating light in response to light passing therethrough;

first mirror means for reflecting light generated in said light generation layer toward said light generation layer;

second mirror means for reflecting light generated in said light generation layer toward said light generation layer, said first and second mirror means being located on opposite sides of said light generation layer;

a plurality of light isolation regions, each said light isolation region extending through said first mirror means to said second mirror means, said light isolation dividing said light generation layer into a plurality of light generation regions, each said light generation region corresponding to one of said SELs, each said light isolation region preventing light generated in one of said light generation regions from propagating into a neighboring light generation region;

a dielectric layer in contact with a surface of said SEL array and a heat conducting layer in contact with said dielectric layer.

6. An SEL array comprising a plurality of SELs, said SEL array comprising:

a light generation layer for generating light in response to light passing therethrough;

first mirror means for reflecting light generated in said light generation layer toward said light generation layer;

second mirror means for reflecting light generated in said light generation layer toward said light generation layer, said first and second mirror means being located on opposite sides of said light generation layer;

a plurality of light insolation regions, each said light isolation region extending through said first mirror means to said second mirror means, said light isolation dividing said light generation layer into a plurality of light generation regions, each said light generation region corresponding to one of said SELs, each said light isolation region being positioned to prevent light generated in one of said light generation regions from propagating into a neighboring light generation region;

a dielectric layer in contact with a surface of said SEL array and a heat conducting layer in contact with said dielectric layer; and a heat sink, said heat conducting layer being thermally connected to said heat sink.

* * * * *